United States Patent
Nishinohara (10) Patent No.: US 8,207,951 B2
(45) Date of Patent: Jun. 26, 2012

(54) MATRIX ARRAY DRIVE DEVICE, DISPLAY AND IMAGE SENSOR

(75) Inventor: Daisuke Nishinohara, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 931 days.

(21) Appl. No.: 12/187,774

(22) Filed: Aug. 7, 2008

(65) Prior Publication Data

US 2009/0040149 A1 Feb. 12, 2009

(30) Foreign Application Priority Data

Aug. 8, 2007 (JP) .................................. 2007-206988
Aug. 22, 2007 (JP) .................................. 2007-215744

(51) Int. Cl.
*G06F 3/038* (2006.01)
*G09G 3/30* (2006.01)
(52) U.S. Cl. ............ 345/204; 345/76; 345/80; 345/213; 345/214
(58) Field of Classification Search .................... 345/76, 345/89
See application file for complete search history.

(56) References Cited

U.S. PATENT DOCUMENTS

| | | | | |
|---|---|---|---|---|
| 5,248,963 A * | 9/1993 | Yasui et al. | ...................... | 345/98 |
| 6,710,549 B2 * | 3/2004 | Okada et al. | ................ | 315/169.3 |
| 7,123,220 B2 * | 10/2006 | Hanari et al. | .................... | 345/77 |
| 7,271,784 B2 * | 9/2007 | Koyama | .......................... | 345/76 |
| 7,460,090 B2 * | 12/2008 | Kota et al. | ........................ | 345/76 |
| 2002/0175631 A1 * | 11/2002 | Kim | ............................ | 315/169.1 |
| 2004/0004595 A1 * | 1/2004 | Isami et al. | ...................... | 345/89 |

FOREIGN PATENT DOCUMENTS

| | | |
|---|---|---|
| JP | 06-176593 | 6/1994 |
| JP | 2001-265282 | 9/2001 |
| JP | 2003-188691 | 7/2003 |
| JP | 2003-280586 | 10/2003 |

* cited by examiner

*Primary Examiner* — Amare Mengistu
*Assistant Examiner* — Sarvesh J Nadkarni
(74) *Attorney, Agent, or Firm* — Fish & Richardson P.C.

(57) ABSTRACT

A matrix array drive device according to the present invention includes: a horizontal scanning circuit controlling signal electrodes in a matrix array such that data signals corresponding to N rows of the matrix array are latched one row after another every horizontal scanning period of a predetermined length and a latch output for each row is continued to be produced for every horizontal scanning periods of N rows; and a vertical scanning circuit controlling scanning electrodes in the matrix array such that the matrix array is simultaneously driven N rows at a time and rows to be driven is shifted one row every horizontal scanning period.

6 Claims, 9 Drawing Sheets

MATRIX ARRAY DRIVE DEVICE, DISPLAY AND IMAGE SENSOR

CROSS-REFERENCE TO RELATED APPLICATIONS

This application is based on Japanese Patent Applications No. 2007-206988 filed on Aug. 8, 2007 and No. 2007-215744 filed on Aug. 22, 2007, the contents of which are hereby incorporated by reference.

BACKGROUND OF THE INVENTION

1. Field of the Invention

The present invention relates to a matrix array drive device for driving a passive matrix array, and a display and an image sensor incorporating such a matrix array drive device.

2. Description of Related Art

In recent years, liquid crystal displays and organic EL (electroluminescence) displays have been widely used as monitors for use in television broadcast receivers, personal computers, mobile telephones and the like due to their advantages such as light weight, slimness and low power consumption.

There are two methods for driving these dot matrix displays. One is an active matrix method in which active elements are disposed at intersections between scanning electrodes (row electrodes) and signal electrodes (column electrodes), and pixels to be lit are selected by the turning on and off of the active elements; the other is a passive matrix method (simple matrix method) in which only pixels are disposed at intersections between scanning electrodes and signal electrodes, and pixels to be lit are directly selected. In particular, most organic EL displays employ the latter method, the passive matrix method, as their drive method.

Examples of a conventional technology related to the foregoing are disclosed in JP-A-2003-280586 and JP-A-2001-265282 (hereinafter called patent document 1 and patent document 2, respectively).

To be sure, in displays employing the passive matrix method, the structure of elements is simple and a high degree of working accuracy is not necessarily required. Thus, it is possible to reduce production cost.

In a conventional passive matrix method, however, N rows of scanning electrodes are scanned one after another, and light is emitted row by row (in other words, vertical scanning is performed line by line), with the result that a period T' during which one line is selected is 1/N of a unit period T during which one frame is scanned. Thus, as the number N of scanning electrodes is increased, the period T' during which one line is selected is decreased. Hence, in the case of, for example, an organic EL display, in order to maintain an average brightness required for display, it is necessary to allow each pixel to emit light with N times higher brightness. This places a burden on pixel media and thus causes reduced life and reduced efficiency (for example, reduced quantum efficiency of organic EL elements).

As an example of a conventional technology that overcomes this disadvantage, patent document 1 discloses and proposes a method (so-called double-scan method) in which a screen is divided into two blocks, an upper block and a lower block, and instantaneous current passed through pixels is reduced by driving each block simultaneously.

Disadvantageously, however, for the adoption of such method, a frame memory or the like that latches image data of at least one frame, that is, large circuit overhead is required, and the outputting of image data is delayed by at least one frame, with the result the image data received cannot be displayed in real time.

As an example of a conventional technology that overcomes this disadvantage, patent document 2 discloses and proposes an image display device that has a row drive circuit and a column drive circuit, the row drive circuit having the capability of: simultaneously driving two or more scanning electrodes disposed side by side; continuously producing light emission of light-emitting elements in a horizontal section of scanning electrodes that simultaneously drive light-emitting elements; and thus lighting light-emitting elements one after another, the column drive circuit having the capability of controlling current passed through data electrodes so as to prevent variations in current density of the light-emitting elements.

Disadvantageously, however, in the conventional technology described above, when data for the (N+1)th row is outputted, the reduction of instantaneous current passed through pixels is achieved by selecting not only the (N+1)th row and the Nth row, with the result that an image extends upward and this noticeably reduces vertical resolution.

SUMMARY OF THE INVENTION

An object of the present invention is to provide a matrix array drive device that can reduce instantaneous current passed through pixels without enlarging a circuit and reducing resolution, and a display and an image sensor incorporating such a matrix array drive device.

To achieve the above object, according to one aspect of the present invention, there is provided a matrix array drive device including: a horizontal scanning circuit controlling signal electrodes in a matrix array such that data signals corresponding to N rows (where N is an integer of two or greater) of the matrix array are latched one row after another every horizontal scanning period of a predetermined length and a latch output for each row is continued to be produced for every horizontal scanning periods of N rows; and a vertical scanning circuit controlling scanning electrodes in the matrix array such that the matrix array is simultaneously driven N rows at a time and rows to be driven is shifted one row every the horizontal scanning period.

Other features, elements, steps, advantages and characteristics of the present invention will be further apparent from the following detailed description of preferred embodiments and the accompanying drawings thereof.

DETAILED DESCRIPTION OF PREFERRED EMBODIMENTS

Hereinafter, the present invention will be described by way of example of a case where the invention is applied to an organic EL display.

Figure 1:
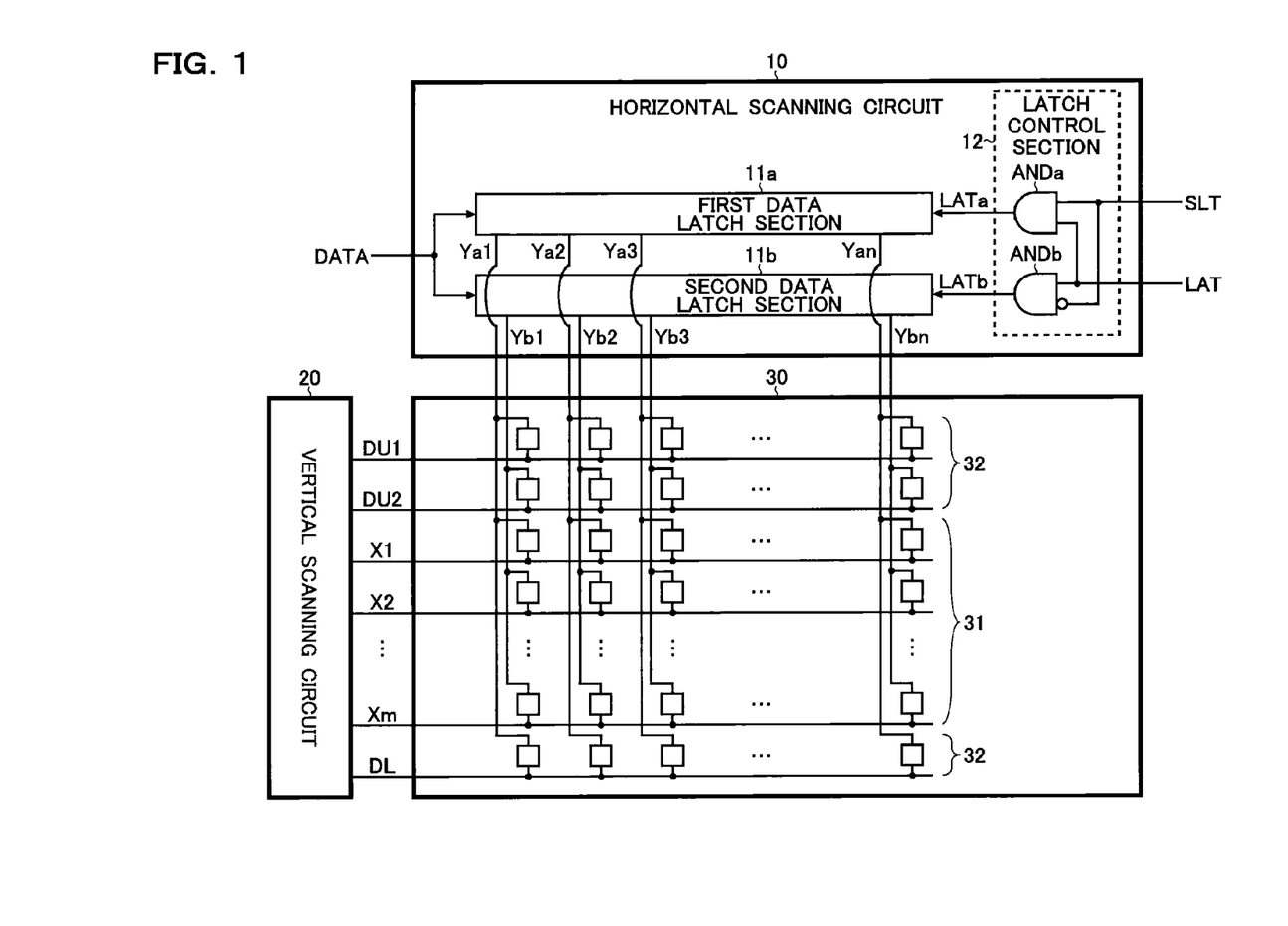
FIG. 1 a block diagram showing a display according to an embodiment of the present invention.

FIG. 1 a block diagram showing an organic EL display according to an embodiment of the present invention.

As shown in FIG. 1, the organic EL display of this embodiment has a horizontal scanning circuit 10, a vertical scanning circuit 20 and an organic EL display panel 30.

The horizontal scanning circuit 10 controls signal electrodes (signal electrodes Ya1 to Yan for odd columns and signal electrodes Yb1 to Ybn for even columns) in the organic EL display panel 30 so as to latch data signals DATA corresponding to two rows of the organic EL display panel 30 one row after the next every horizontal scanning period of a predetermined length and continue to produce a latch output for each row every horizontal scanning period of two rows. The horizontal scanning circuit 10 has a first data latch section 11a, a second data latch section 11b and a latch control section 12.

The first data latch section 11a serves as means for storing inputted data signals DATA one after another and producing, according to a first trigger signal LATa, a latch output of the data signals DATA to pixels constituting rows (odd rows) for which the latch output is produced. The second data latch section 11b serves as means for storing inputted data signals DATA one after another and producing, according to a second trigger signal LATb, a latch output of the data signals DATA to pixels constituting rows (even rows) for which the latch output is produced. The interior configurations of the first data latch section 11a and the second data latch section 11b will be described later.

The latch control section 12 serves as means for cyclically outputting the first trigger signal LATa and the second trigger signal LATb to one of the first data latch section 11a and the second data latch section 11b every horizontal scanning period of a predetermined length. The latch control section 12 has logical AND units ANDa and ANDb.

The first input terminal of the logical AND unit ANDa is connected to a terminal via which a selection signal SLT is inputted. The second input terminal of the logical AND unit ANDa is connected to a terminal via which a reference trigger signal LAT is inputted. The output terminal of the logical AND unit ANDa is connected to the first data latch section ha as a terminal via which the first trigger signal LATa is outputted.

The first input terminal of the logical AND unit ANDb is connected to the terminal via which the reference trigger signal LAT is inputted. The second input terminal of the logical AND unit ANDb is connected as an inverting input terminal to the terminal via which the selection signal SLT is inputted. The output terminal of the logical AND unit ANDb is connected to the second data latch section 11b as a terminal via which the second trigger signal LATb is outputted.

Specifically, when the reference trigger signal LAT is high, if the selection signal SLT is high, the first trigger signal LATa becomes high and the second trigger signal LATb becomes low. In contrast, when the reference trigger signal LAT is high, if the selection signal SLT is low, the first trigger signal LATa becomes low and the second trigger signal LATb becomes high. When the reference trigger signal LAT is low, the first trigger signal LATa and the second trigger signal LATb become low irrespective of the logic state of the selection signal SLT.

The vertical scanning circuit 20 controls scanning electrodes (including scanning electrodes X1 to Xm constituting a pixel section 31 and dummy scanning electrodes DU1, DU2 and DL constituting a dummy pixel section 32) in the organic EL display panel 30 so as to simultaneously drive the organic EL display panel 30 two rows at a time and shift the rows to be driven one after another. The interior configuration of the vertical scanning circuit 20 will be described later.

The organic EL display panel 30 is a matrix array employing a passive matrix method (simple matrix method), in which pixels (organic EL elements) are disposed at intersections between the horizontally arranged scanning electrodes X1 to Xm and the vertically arranged first signal electrodes Ya1 to Yan (for odd columns) and the second signal electrodes Yb1 to Ybn (for even columns), and pixels to be lit are directly selected.

In the organic EL display panel 30, the pixel section 31 is formed in the area where the scanning electrodes X1 to Xm intersect with the first signal electrodes Ya1 to Yan and the second signal electrodes Yb1 to Ybn, and the dummy pixel section 32 is also formed in which the unused dummy pixels are arranged around the pixel section 31. The provision of the dummy pixel section 32 can eliminate layout dependence (loss of surrounding pixels, poor characteristics and the like).

To achieve this, the organic EL display panel 30 has, as dummy scanning and signal electrodes that are connected to the dummy pixels, the dummy scanning electrodes DU1, DU2 and DL on the upper and lower sides of the panel and dummy signal electrodes (unillustrated) on the right and left sides of the panel.

A detailed description will now be given of the interior configuration of the first data latch section 11a (the second data latch section 11b) with reference to FIG. 2.

Figure 2:
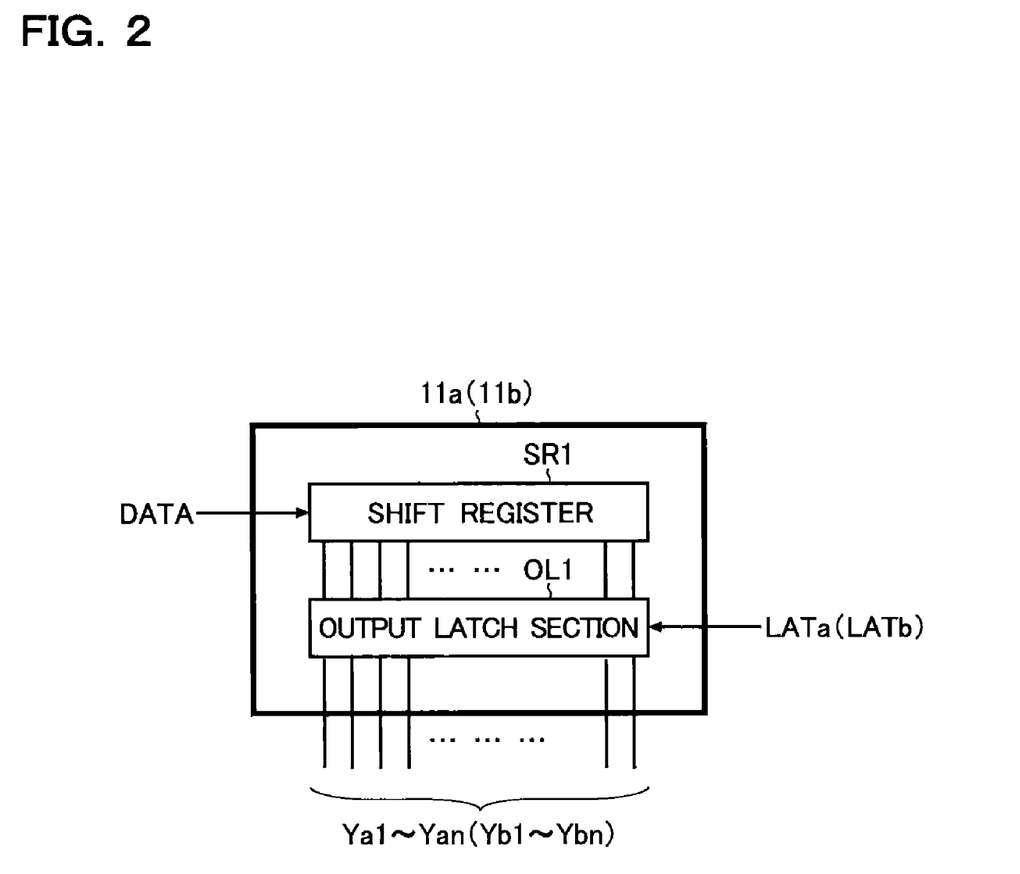
FIG. 2 is a block diagram showing an example of the configuration of a first data latch circuit ha (a second data latch circuit 11*b*)

FIG. 2 is a block diagram showing an example of the configuration of the first data latch circuit 11a (the second data latch circuit 11b).

As shown in FIG. 2, the first data latch circuit 11a (the second data latch circuit 11b) of this configuration has a shift register SR1 and an output latch section OL1.

The shift register SR1 serves as means for storing, by being triggered by an unillustrated clock, the serially inputted data signal DATA while the data signal DATA is shifted one digit after another.

The output latch section OL1 serves as means for feeding, by being triggered by the first trigger signal LATa (the second trigger signal LATb) inputted from the latch control section 12, the data signal DATA stored in the shift register SR1 to the first signal electrodes Ya1 to Yan (the second signal electrodes Yb1 to Ybn).

A detailed description will now be given of the interior configuration of the vertical scanning circuit 20 with reference to FIG. 3.

Figure 3:
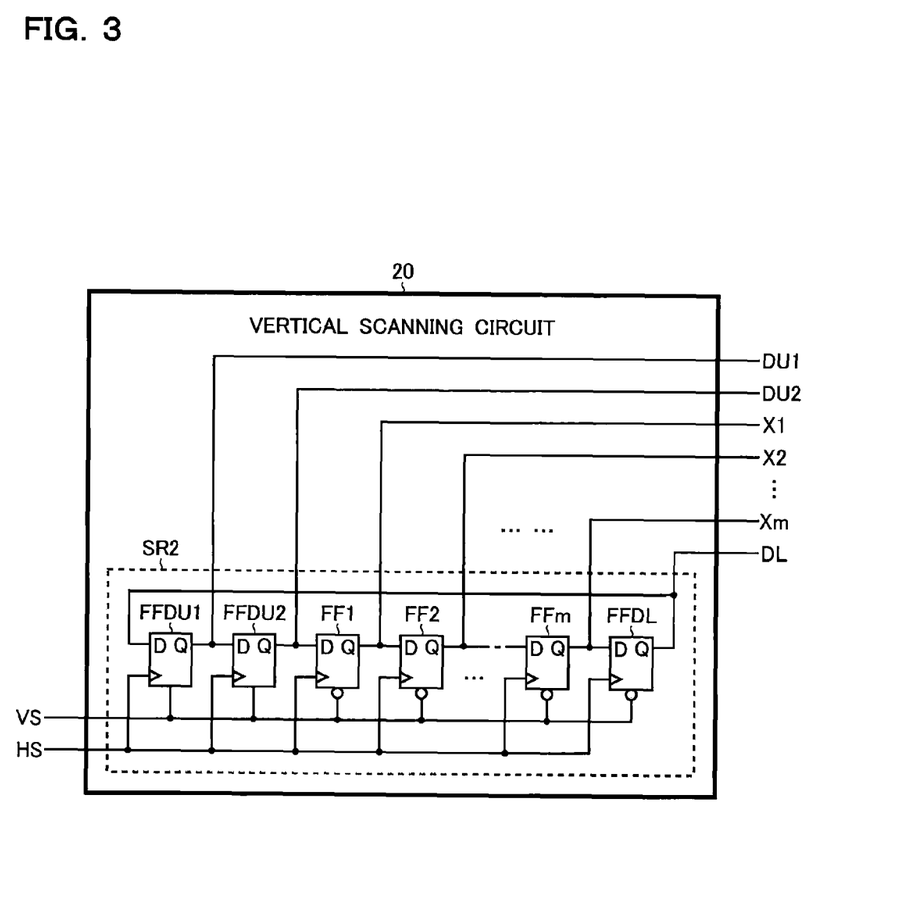
FIG. 3 is a block diagram showing an example of the configuration of a vertical scanning circuit 20.

FIG. 3 is a block diagram showing an example of the configuration of the vertical scanning circuit 20.

As shown in FIG. 3, the vertical scanning circuit 20 of this configuration has a loop shift register SR2 in which D-type flip-flops FFDU1, FFDU2, FF1 to FFm and FFDL are connected in series and arranged side by side in multiple stages. The output terminals of the D-type flip-flops are connected to the dummy scanning electrodes DU1 and DU2, the scanning electrodes X1 to Xm and the dummy scanning electrode DL.

The flip-flops FFDU1, FFDU2, FF1 to FFm and FFDL each operate by being triggered by a horizontal synchronization signal HS fed to their clock terminals. In the flip-flops FFDU1 and FFDU2 in the first two stages, their output logic states are initialized to the active state (here, low-level state) when the flip-flops are triggered by a vertical synchronization signal VS fed to the set terminals. In the remaining flip-flops FF1 to FFm and FFDL, their output logic states are initialized to the inactive state (here, high-level state) when the flip-flops are triggered by the vertical synchronization signal VS fed to the reset terminals.

Specifically, the vertical scanning circuit 20 of this configuration is initialized, every vertical scanning period of a predetermined length, to a state in which the dummy scanning electrodes DU1 and DU2 of two rows disposed above the scanning electrode X1 in the first row are driven simultaneously. With this configuration, it is possible to simultaneously drive the organic EL display panel 30 two rows at a time extremely simply and smoothly, without the need for an additional pulse generation section, by the use of the shift register SR2 alone.

When this configuration is employed, the dummy scanning electrodes DU1 and DU2 of two rows are required above the scanning electrode X1.

A detailed description will now be given of the operation sequence of the horizontal scanning circuit 10 and the vertical scanning circuit 20 configured as described above with reference to FIG. 4.

Figure 4:
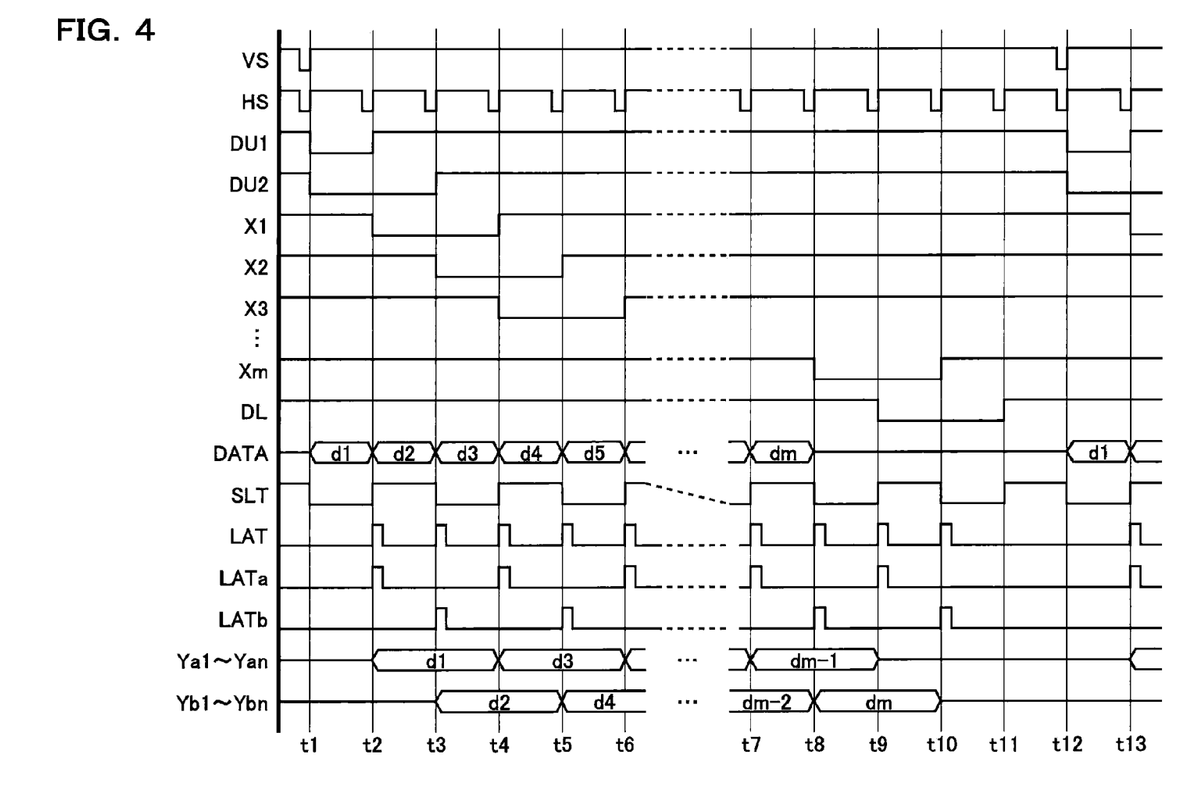
FIG. 4 is a timing chart describing the operation sequence of a horizontal scanning circuit 10 and the vertical scanning circuit 20.

FIG. 4 is a timing chart describing the operation sequence of the horizontal scanning circuit 10 and the vertical scanning circuit 20. In FIG. 4, as seen from above, the vertical synchronization signal VS, the horizontal synchronization signal HS, the dummy scanning electrodes DU1 and DU2, the scanning electrodes X1 to Xm, the dummy scanning electrode DL, the data signal DATA, the selection signal SLT, a reference trigger signal LAT, the first trigger signal LATa, the second trigger signal LATb, the first signal electrodes Ya1 to Yan and the second signal electrodes Yb1 to Ybn are shown.

During the period between time t1 and time t2, the vertical scanning circuit 20 is initialized, by being triggered by the vertical synchronization signal VS (on the rising edge thereof), to a state in which the dummy scanning electrodes DU1 and DU2 are driven simultaneously. During the period between time t1 and time t2, the data signal DATA for the first row (the first row data d1) is inputted to both the first data latch section 11a and the second data latch section 11b. During the period between time t1 and time t2, the data signal DATA is not outputted to the first signal electrodes Ya1 to Yan and the second signal electrodes Yb1 to Ybn. That is, during the period between time t1 and time t2, the dummy scanning electrodes DU1 and DU2 are selected so that a standby state where input of the first row data d1 is awaited is entered.

During the next period between time t2 and time t3, the latch control section 12 outputs the first trigger signal LATa. The first data latch section 11a outputs, by being triggered by the first trigger signal LATa (on the rising edge thereof, the first row data d1 stored therein to the first signal electrodes Ya1 to Yan. In contrast, since the second trigger signal LATb is not inputted to the second data latch section 11b, the data signal DATA is not outputted to the second signal electrodes Yb1 to Ybn.

During the period between time t2 and time t3, the vertical scanning circuit 20 shifts, by being triggered by the horizontal synchronization signal HS (on the rising edge thereof, the rows to be driven one after another, and thus enters a state in which the dummy scanning electrodes DU1 and DU2 and the scanning electrode X1 in the first row are driven simultaneously. Hence, pixels that are connected to the intersections between the scanning electrode X1 and the first signal electrodes Ya1 to Yan are lit according to the first row data d1. During the period between time t2 and time t3, at the same time when the operation described above is performed, the data signal DATA for the second row (the second row data d2) is inputted to both the first data latch section 11a and the second data latch section 11b.

During the next period between time t3 and time t4, the latch control section 12 outputs the second trigger signal LATb. The second data latch section 11b outputs, by being triggered by the second trigger signal LATb (on the rising edge thereof), the second row data d2 stored therein to the second signal electrodes Yb1 to Ybn. In contrast, since the first trigger signal LATa is not inputted to the first data latch section 11a, the first row data d1 is outputted to the first signal electrodes Ya1 to Yan continuously after the period between time t2 and time t3.

During the period between time t3 and time t4, the vertical scanning circuit 20 shifts, by being triggered by the horizontal synchronization signal HS (on the rising edge thereof), the rows to be driven one after another, and thus enters a state in which the scanning electrode X1 in the first row and the scanning electrode X2 in the second row are driven simultaneously. Hence, pixels that are connected to the intersections between the scanning electrode X1 and the first signal electrodes Ya1 to Yan are lit according to the first row data d1 continuously after the period between time t2 and time t3; pixels that are connected to the intersections between the scanning electrode X2 and the second signal electrodes Yb1 to Ybn are lit according to the second row data d2. During the period between time t3 and time t4, at the same time when the operation described above is performed, the data signal DATA for the third row (the third row data d3) is inputted to both the first data latch section 11a and the second data latch section 11b.

Thereafter, according to the same sequence as described above, the horizontal scanning circuit 10 controls the signal electrodes (Ya1 to Yan and Yb1 to Ybn) in the organic EL display 30 so as to latch the data signals DATA corresponding to two rows of the organic EL display 30 one row after another every horizontal scanning period of a predetermined length and continue to produce a latch output for each row every horizontal scanning period of two rows. The vertical scanning circuit 20 controls the scanning electrodes (DU1, DU2, X1 to Xm and DL) in the matrix array 30 so as to simultaneously drive the matrix array 30 two rows at a time and shift the rows to be driven one after another.

Thus, with the organic EL display of this embodiment, while each latch output of the first data latch section 11a and the second data latch section 11b is updated (during the vertical scanning period of two rows), the associated rows can be driven.

With the organic EL display of this embodiment, it is possible to double the period during which each row is driven without enlarging a circuit and reducing resolution. This makes it possible to reduce instantaneous current passed through pixels to half as compared with a display employing a normal passive matrix method while the average brightness is held constant. Thus, it is possible to reduce a burden on pixel media (such as organic EL elements) susceptible to high instantaneous currents. This helps prevent reduction in life and efficiency.

With the organic EL display of this embodiment, unlike a conventional double-scan method, it is unnecessary to latch a screenful of image data DATA inputted sequentially. Since only the data latch portion of the horizontal scanning circuit 10 is basically enlarged by the addition of a circuit, real-time display can be achieved with the image data DATA without enlargement of the circuitry.

Figure 5:
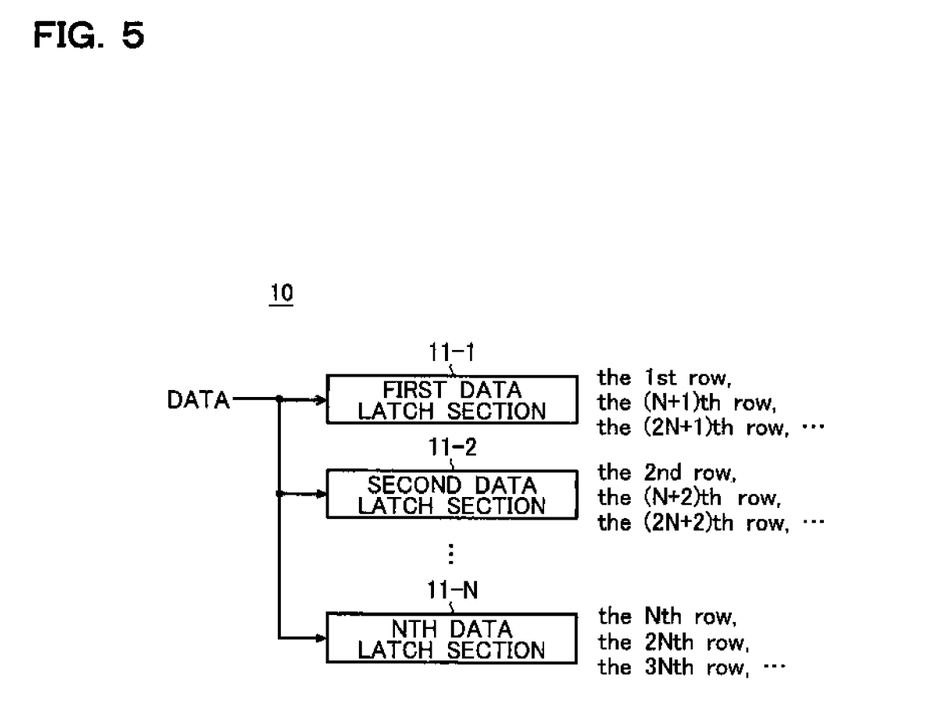
FIG. 5 is a block diagram showing a modified example of the horizontal scanning circuit 20.

Although this embodiment is described by way of example of a case where the period during which each row is driven is doubled and the magnitude of the instantaneous current passed through pixels is reduced to half by the use of the first data latch section 11a and the second data latch section 11b, the present invention is not limited to this configuration. As shown in FIG. 5, the period during which each row is driven may be extended to N times and the magnitude of the instantaneous current passed through pixels may be reduced to 1/N by the use of first to Nth data latch sections 11-1 to 11-N. The number N of stages of data latch sections is appropriately set according to how much the instantaneous current needs to be reduced.

Figure 6:
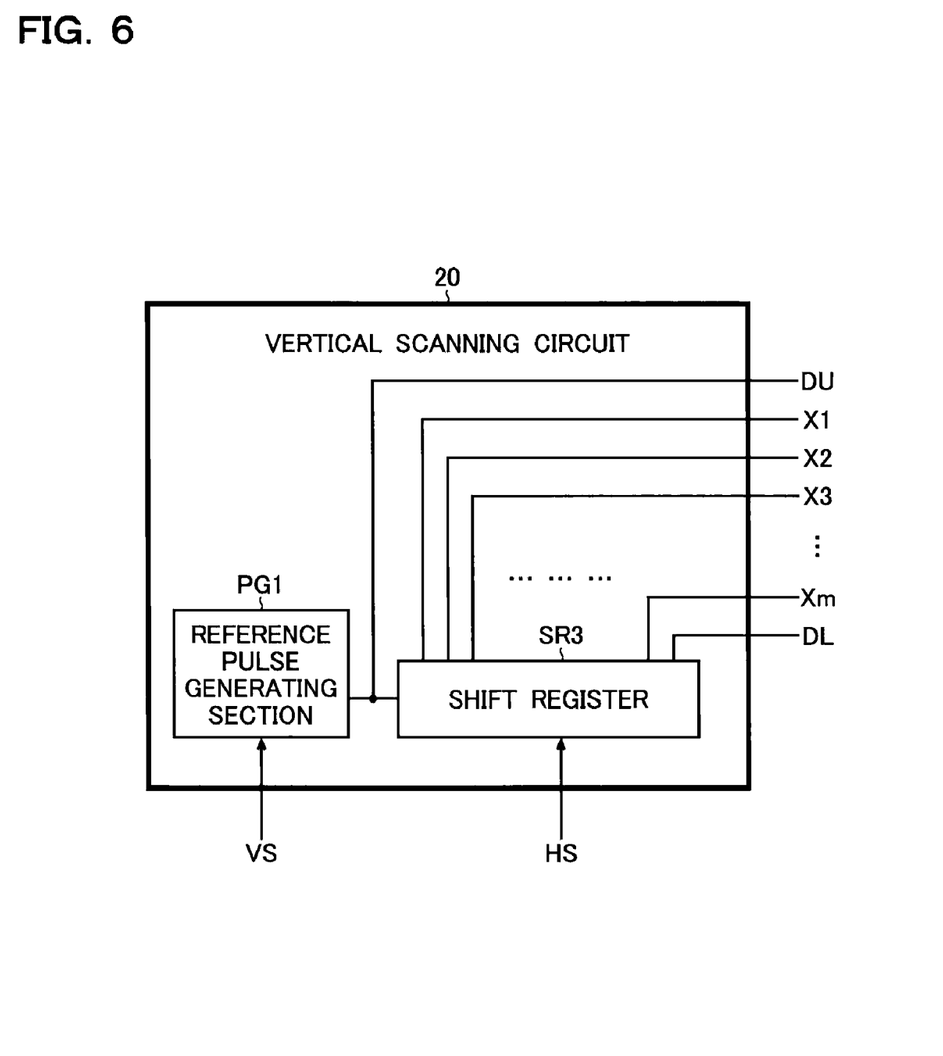
FIG. 6 is a block diagram showing a modified example of the vertical scanning circuit 20.

Although this embodiment is described by way of example of a case where the loop shift register SR2 composed of the D-type flip-flops connected in series and arranged side by side in multiple stages is used as the vertical scanning circuit 20, the present invention is not limited to this configuration. As shown in FIG. 6, the vertical scanning circuit 20 may control the scanning electrodes (DU, X1 to Xm and DL) in the organic EL display panel 30 by the use of both a reference pulse generating section PG1 for generating a reference pulse signal that enters and maintains, by being triggered by the vertical synchronization signal VS, every vertical scanning period, an active state only during a horizontal scanning period of N rows and a shift register SR3 for storing the reference pulse signal while shifting it digit by digit by being triggered by the horizontal synchronization signal HS, every horizontal scanning period.

With the vertical scanning circuit 20 configured as described above, although it is necessary to additionally provide the reference pulse generating section PG1, even when the number N of rows driven simultaneously is increased, there is no need to provide the dummy scanning electrodes of N rows above the scanning electrode X1. Consequently, it is unnecessary to reduce the area covered by the pixel section 31.

Although this embodiment is described by way of example of a case where the present invention is applied to the organic EL display, the invention is not limited to this application. The invention finds wide application in matrix drive devices in general that drive a matrix array (especially one where a limitation is placed on instantaneous current) such as a display (for example, a liquid crystal display) incorporating a pixel array or an image sensor incorporating a sensor array.

Many modifications and variations are possible without departing from the spirit of the present invention.

As described above, according to the invention, instantaneous current passed through pixels can be reduced without enlargement of a circuit and resolution reduction. This makes it possible to reduce a burden on pixel media and thus prevent reduction in life and efficiency.

With respect to industrial applicability of the present invention, the technology of the invention is useful in preventing reduction in life and efficiency of pixel media in a passive matrix display or an image sensor.

A detailed description will now be given of operation stabilization technology of shift registers composed of flip-flops connected in series and arranged side by side in multiple stages, such as shift registers SR1 to SR3 used in the horizontal scanning circuit 10 and the vertical scanning circuit 20.

Figure 8:
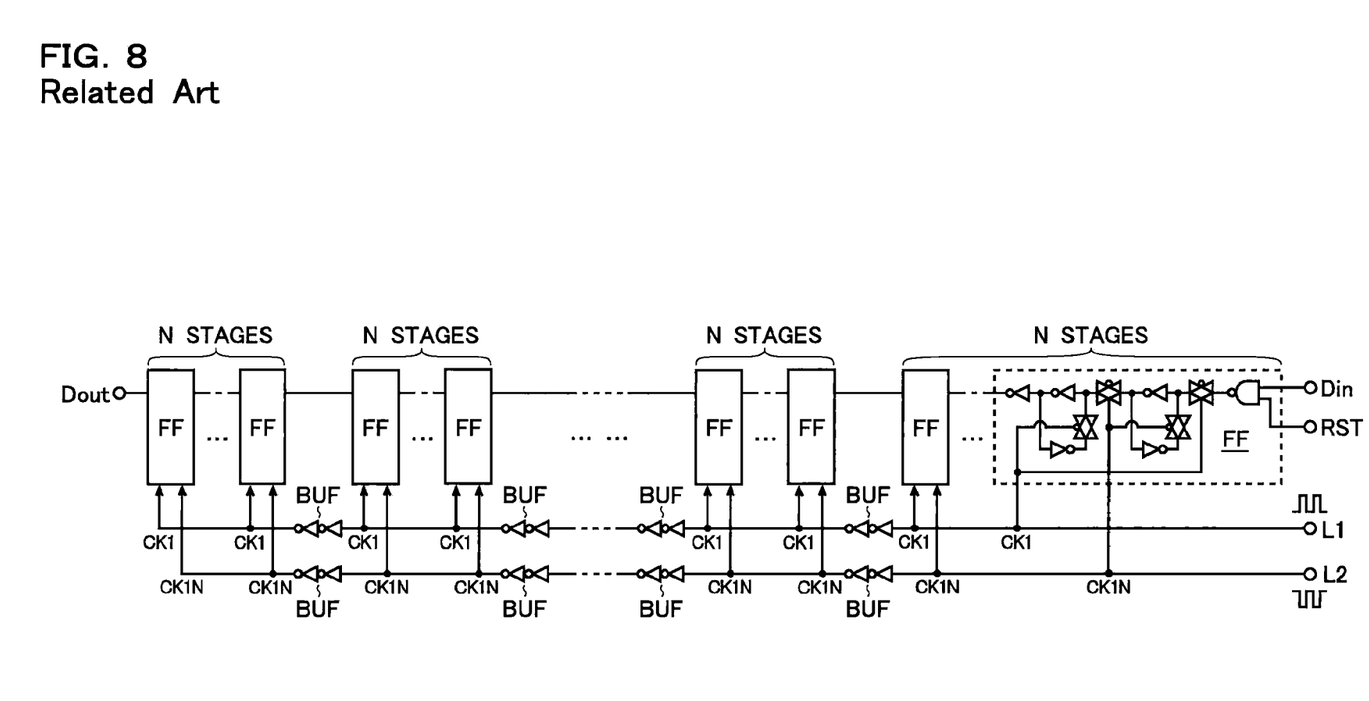
FIG. 8 is a block diagram showing an example of the shift register.

FIG. 8 is a block diagram showing an example of a conventional shift register.

As shown in FIG. 8, in a typical shift register, master-slave D-type flip-flops FF, each composed of inverters connected in a loop, are connected in series and arranged side by side in multiple stages The shift register stores serial input data Din while shifting its digits one digit after another by the use of a clock signal CK1 inputted from a first clock line L1 and an inverted clock signal CK1N (a clock signal obtained by inverting the phase of the clock signal CK1) from a second clock line L2.

In a case where the number of series stages of the D-type flip-flops FF is large, as shown in FIG. 8, buffers BUF (two-stage series circuits composed of inverters) are inserted, one for every N stages (where N is more than one) of the D-type flip-flops FF, in each of the first clock line L1 and the second clock line L2, as means for preventing the attenuation (bluntness) of the clock signal CK1 and the inverted clock signal CK1N.

Examples of a conventional technology related to the foregoing are disclosed in JP-A-H06-176593 and JP-A-2003-188691 (hereinafter called patent document 3 and patent document 4, respectively).

To be sure, the conventional shift register described above can be applied to various products such as display drivers, liquid crystal displays, organic EL displays, memory drivers, SRAMs, DRAMs, image sensors, FIFOs and FILOs (digital delay circuits).

Disadvantageously, however, in the conventional shift register, the wire that branches off from the first clock line L1 to allow transmission of the clock signal CK1 to the D-type flip-flops FF is different in length from the wire that branches off from the second clock line L2 to allow transmission of the inverted clock signal CK1N to the D-type flip-flops FF, and this produces a difference between a load applied to the first clock line L1 and that applied to the second clock line L2 according to the difference in wire length.

For example, in the example of FIG. 8, the first clock line L1 is arranged closer to the D-type flip-flop FF in each stage than the second clock line L2. Thus, the load applied to the first clock line L1 is relatively light, and the load applied to the second clock line L2 is relatively heavy.

Hence, in the conventional shift register, when the D-type flip-flops FF are connected in multiple stages (several hundreds of stages), as the clock lines L1 and L2 extend toward the final stage, the total difference between loads applied to the clock lines L1 and L2 becomes accumulatively larger. Thus, the difference in delay between the clock signal CK1 and the inverted clock signal CK1N becomes noticeable.

The difference in delay between the clock signal CK1 and the inverted clock signal CK1N is produced as described above, and this causes these signals to become out of phase with each other. Thus, it is likely that the operation of each of the D-type flip-flops FF cannot be assured (that is, among analog switches constituting the D-type flip-flop FF, a pair of switches that need to be turned on and off in a complementary manner is turned on, and this results in unstable operation that can cause missing data). Consequently, the shift register as a whole may malfunction.

Figure 9A:
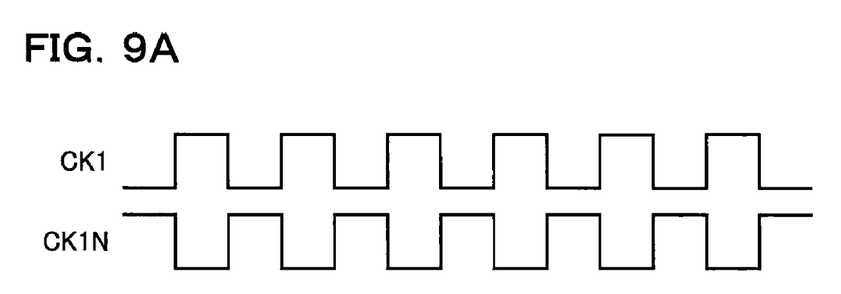
FIGS. 9A and 9B are chart diagrams describing the cause of defective operation of the shift register.
Figure 9B:
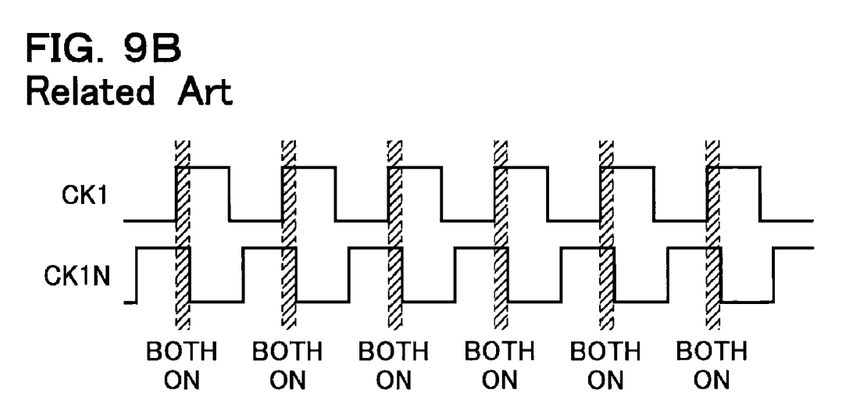

FIGS. 9A and 9B are chart diagrams describing the cause of defective operation of the shift register described above. FIG. 9A shows a case where the clock signal CK1 is not out of phase with the inverted clock signal CK1N; FIG. 9B shows a case where the clock signal CK1 is out of phase with the inverted clock signal CK1N. The hatched portion of FIG. 9B indicates a period during which among analog switches constituting the D-type flip-flop FF, a pair of switches that need to be turned on and off in a complementary manner is kept on.

One way to prevent the phase difference between the clock signal CK1 and the inverted clock signal CK1N is to provide only one clock line through which the clock signal CK1 is fed and generate the inverted clock signal CK1N from the clock signal CK1 individually in the D-type flip-flop FF in each stage. With this configuration, however, an inverter is additionally required in the D-type flip-flop FF in each stage, and this causes enlargement of the circuit. Such a way is impractical particularly in terms of achieving the multiple-stage arrangement of the D-type flip-flops FF.

In view of the foregoing disadvantage, a shift register will be described below that can achieve stable operation without enlarging a circuit.

Figure 7:
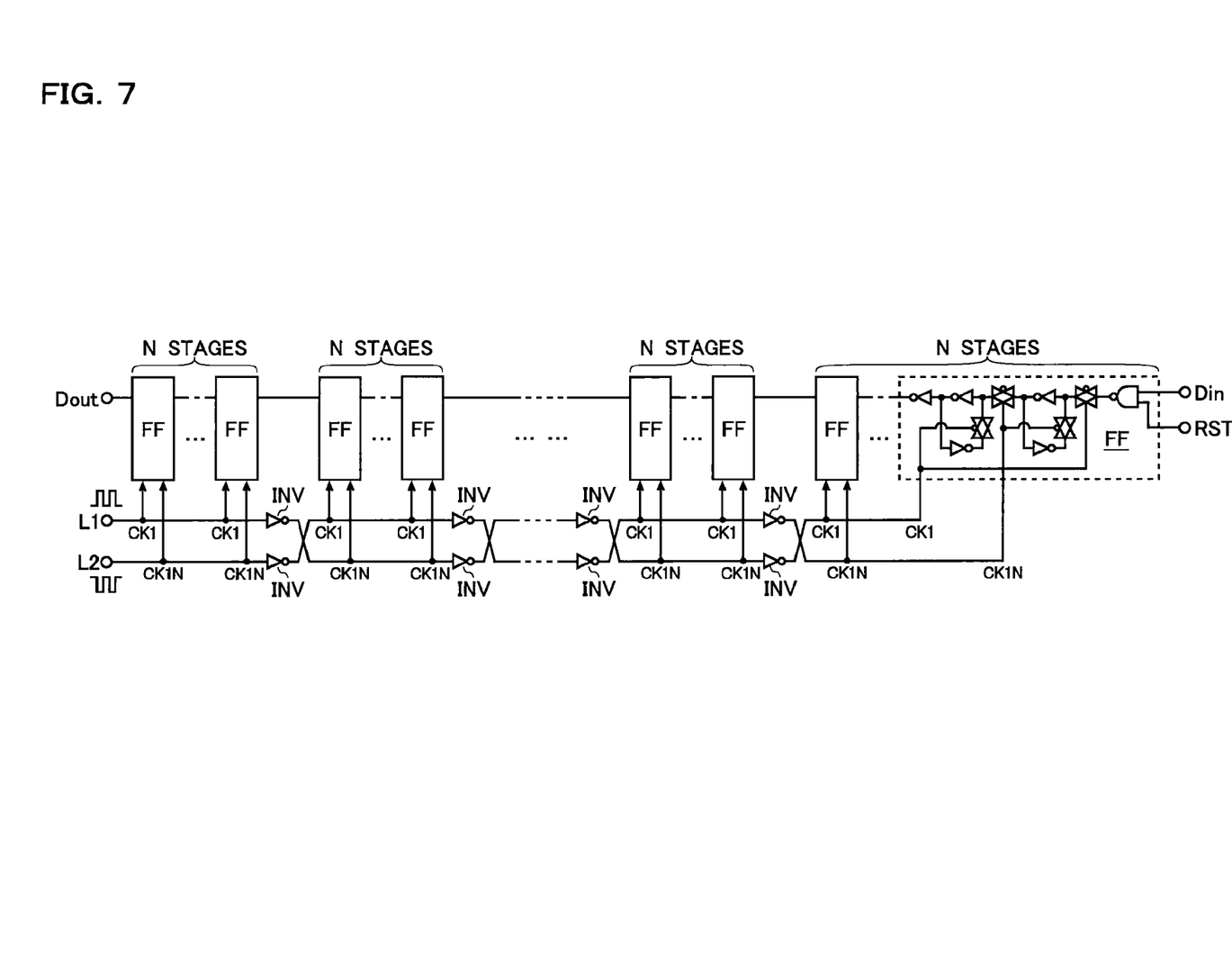
FIG. 7 a block diagram showing a shift register according to an embodiment of the present invention.

FIG. 7 is a block diagram showing a shift register according to an embodiment of the present invention.

As shown in FIG. 7, in the shift register of this embodiment, master-slave D-type flip-flops FF, each composed of inverters connected in a loop, are connected in series and arranged side by side in multiple stages (although the interior configuration of the first-stage master-slave D-type flip-flop FF alone is shown in FIG. 7, the master-slave D-type flip-flops FF in the second to the final stages have the same interior configuration as that shown in FIG. 7). The shift register stores serial input data Din while shifting its digits one digit after another by the use of the clock signal CK1 inputted from one of the first clock line L1 and the second clock line L2 and the inverted clock signal CK1N (a clock signal obtained by inverting the phase of the clock signal CK1) inputted from the other clock line.

In particular, in the shift register of this embodiment, the first clock line L1 and the second clock line L2 are configured such that the exchange of arrangement positions, the inversion of the logic states of signals and the exchange of signal destinations are performed for every predetermined number N of stages of the D-type flip-flops FF (for example, N is about 16 when the number of all stages of D-type flip-flops FF is 640).

More specifically, the first clock line L1 and the second clock line L2 are configured such that their arrangement positions are exchanged every time the clock signal CK1 and the inverted clock signal CK1N are fed, as shown in FIG. 7, to the D-type flip-flops FF in the N stages.

Hence, in one section, the first clock line L1 is arranged closer to the D-type flip-flops FF than the second clock line L2, and thus the load applied to the first clock line L1 is relatively light and the load applied to the second clock line L2 is relatively heavy. In the next section, their positional relationship is reversed, and thus the load applied to the first clock line L1 is relatively heavy and the load applied to the second clock line L2 is relatively light. Thereafter, in every predetermined section, the arrangement positions of the first clock line L1 and the second clock line L2 are exchanged, and thus the magnitudes of the loads applied to them are exchanged.

The first clock line L1 and the second clock line L2 each have an inverter INV that inverts the logic state of a signal passed therethrough every time the clock signal CK1 and the inverted clock signal CK1N are fed to the D-type flip-flops FF in the N stages.

Thus, it is possible not only to exchange the arrangement positions of the first clock line L1 and the second clock line L2 but also to appropriately invert the logic states of signals passed therethrough.

Moreover, the first clock line L1 and the second clock line L2 are configured such that their signal destinations are exchanged, as shown in FIG. 7, between the clock signal input terminal and the inverting clock signal input terminal of the D-type flip-flop FF every time their arrangement positions are exchanged and the logic states of the signals are inverted.

Thus, it is possible not only to exchange the arrangement positions of the first clock line L1 and the second clock line L2 and invert the logic states of the signals but also to exchange their signal destinations appropriately.

The roles of the first clock line L1 and the second clock line L2 are exchanged for every any number N of stages as described above, and thus the first and second clock lines L1 and L2 alternate between the section where the load applied thereto is relatively light and the section where the load applied thereto is relatively heavy. In this way, the load applied to the first clock line L1 can be made equal to the load applied to the second clock line L2.

Hence, with the shift register of this embodiment, even when the D-type flip-flops FF are connected in multiple stages (several hundreds of stages), the phase relationship between the clock signal CK1 and the inverted clock signal CK1N can be appropriately maintained to the final stage. Thus, it is possible to prevent defective operation of each of the D-type flip-flops FF without fail to achieve stable operation of the shift register.

In particular, the technology of the shift register of this embodiment is useful in achieving stable operation of high-resolution (such as VGA or XGA) liquid crystal displays having a multiple-stage scanning system, organic EL displays, image sensors, large-capacity SRAMs, DRAMs, FIFOs, FILOs (digital delay circuits), drivers for driving these devices or the like.

The present invention is not limited to these applications. The invention finds wide application in semiconductor integrated circuit devices in general that have a large-sized shift register composed of flip-flops connected in series and arranged side by side in multiple stages.

In the shift register of this embodiment, the inverters INV disposed in the first clock line L1 and the second clock line L2 serve as means not only for inverting the logic states of signals but also for preventing the attenuation (bluntness) of the clock signal CK1 and the inverted clock signal CK1N.

In the shift register of this embodiment, the inverters INV do not need to be additionally provided, and omitting one inverter from the buffers BUF (two-stage series circuits composed of inverters) shown in FIG. 8 and described previously makes the inverters INV available.

Thus, with the shift register of this embodiment, it is possible not only to prevent enlargement of a circuit but also to reduce the size of the circuit when stable operation is achieved.

As shown in FIG. 7, in the shift register of this embodiment, the direction in which signals are inputted to the first clock line L1 and the second clock line L2 is opposite to that in which data is inputted to the D-type flip-flops FF. With this configuration, the D-type flip-flops FF located in further downstream stages can perform latch operation more stably. Thus, it is possible to achieve more stable operation of the shift resister as a whole.

Many modifications and variations are possible without departing from the spirit of the invention.

As described above, with the shift register according to the present invention, it is possible to achieve stable operation without enlarging a circuit.

With respect to industrial applicability of the present invention, the technology of the invention is useful in achieving stable operation of devices incorporating a shift register composed of flip-flops connected in series and arranged side by side in multiple stages, such as display drivers, liquid crystal displays, organic EL displays, memory drivers, SRAMs, DRAMs, image sensors, FIFOs and FILOs (digital delay circuits).

Although the above description discusses preferred embodiments of the present invention, variations of the disclosed invention are possible in various ways. It will be apparent to a person skilled in the art that various embodiments other than those described above are possible. Thus, it is intended that the appended claims cover all such variations and modifications in a technical manner without departing from the spirit and the technical scope of the invention.

What is claimed is:

1. A matrix array drive device comprising:
   a horizontal scanning circuit controlling signal electrodes in a matrix array such that data signals corresponding to N rows (where N is an integer of two or greater) of the matrix array are latched one row after another every horizontal scanning period of a predetermined length and a latch output for each row continues to be produced for every horizontal scanning period of N rows; and
   a vertical scanning circuit controlling scanning electrodes in the matrix array such that the matrix array is simultaneously driven N rows at a time, and rows to be driven are shifted one row each horizontal scanning period,
   wherein the vertical scanning circuit includes a loop shift register that is operated by receiving a horizontal synchronization signal and a vertical synchronization signal, and is initialized, every vertical scanning period of a predetermined length, to a state in which dummy scanning electrodes of N rows disposed above a group of scanning electrodes are driven simultaneously,
   wherein the loop shift register comprises a plurality of flip-flops connected in series and in multiple stages,
   wherein output terminals of the flip-flops of N stages from a front are connected to the dummy scanning electrodes of N rows disposed above the group of scanning electrodes, and output terminals of the remaining flip-flops are connected to the group of scanning electrodes and dummy scanning electrodes disposed below the group of scanning electrodes,
   wherein an operation of the plurality of flip-flops is individually triggered by the horizontal synchronization signal input to a clock terminal, and
   wherein the flip-flops of N stages from the front are triggered by the vertical synchronization signal input to a set terminal such that an output logic thereof is initialized to an active state, and the remaining flip-flops are triggered by the vertical synchronization signal input to a reset terminal such that an output logic thereof is initialized to an inactive state.

2. The matrix array drive device of claim 1, wherein the horizontal scanning circuit comprises:
   first to Nth data latch sections storing the data signals inputted thereto one signal after another and producing, according to a predetermined trigger signal, a latch output of the data signals to pixels constituting rows for which the latch output is produced; and
   a latch control section cyclically outputting the trigger signal to one of the first to the Nth data latch sections every said horizontal scanning period.

3. A display comprising:
   a matrix array composed of groups of pixels; and
   a matrix array drive device for driving the matrix array, wherein the matrix array drive device comprises:
      a horizontal scanning circuit controlling signal electrodes in a matrix array such that data signals corresponding to N rows (where N is an integer of two or greater) of the matrix array are latched one row after another every horizontal scanning period of a predetermined length and a latch output for each row continues to be produced for eve horizontal scanning period of N rows; and
      a vertical scanning circuit controlling scanning electrodes in the matrix array such that the matrix array is simultaneously driven N rows at a time and rows to be driven are shifted one row every said horizontal scanning period, and
   wherein the vertical scanning circuit includes a loop shift register that is operated by receiving a horizontal synchronization signal and a vertical synchronization signal, and is initialized, every vertical scanning period of a predetermined length, to a state in which dummy scanning electrodes of N rows disposed above a group of scanning electrodes are driven simultaneously,
   wherein the loop shift register comprises a plurality of flip-flops connected in series and in multiple stages,
   wherein output terminals of the flip-flops of N stages from a front are connected to the dummy scanning electrodes of N rows disposed above the group of scanning electrodes, and output terminals of the remaining flip-flops are connected to the group of scanning electrodes and dummy scanning electrodes disposed below the group of scanning electrodes,
   wherein an operation of the plurality of flip-flops is individually triggered by the horizontal synchronization signal input to a clock terminal, and
   wherein the flip-flops of N stages from the front are triggered by the vertical synchronization signal input to a set terminal such that an output logic thereof is initialized to an active state, and the remaining flip-flops are triggered by the vertical synchronization signal input to a reset terminal such that an output logic thereof is initialized to an inactive state.

4. The display of claim 3, wherein the horizontal scanning circuit comprises:
   first to Nth data latch sections storing the data signals inputted thereto one signal after another and producing, according to a predetermined trigger signal, a latch output of the data signals to pixels constituting rows for which the latch output is produced; and
   a latch control section cyclically outputting the trigger signal to one of the first to the Nth data latch sections every said horizontal scanning period.

5. An image sensor comprising:
   a matrix array composed of groups of sensors; and
   a matrix array drive device for driving the matrix array, wherein the matrix array drive device comprises:
      a horizontal scanning circuit controlling signal electrodes in the matrix array such that data signals corresponding to N rows (where N is an integer of two or greater) of the matrix array are latched one row after another every horizontal scanning period of a predetermined length and a latch output for each row continues to be produced for every horizontal scanning periods of N rows; and
      a vertical scanning circuit controlling scanning electrodes in the matrix array such that the matrix array is simultaneously driven N rows at a time and rows to be driven are shifted one row every said horizontal scanning period, and
   wherein the vertical scanning circuit includes a loop shift register that is operated by receiving a horizontal synchronization signal and a vertical synchronization signal, and is initialized, every vertical scanning period of a predetermined length, to a state in which dummy scanning electrodes of N rows disposed above a group of scanning electrodes are driven simultaneously, wherein the shift register comprise a plurality of flip-flops connected in series and in multiple stages, wherein output terminals of the flip-flops of N stages from a front are connected to the dummy scanning electrodes of N rows disposed above the group of scanning electrodes, and output terminals of the remaining flip-flops are connected to the group of scanning electrodes and dummy scanning electrodes disposed below the group of scanning electrodes, wherein an operation of the plurality of flip-flops is individually triggered by the horizontal synchronization signal input to a clock terminal, and wherein the flip-flops of N stages from the front are triggered by the vertical synchronization signal input to a set terminal such that an output logic thereof is initialized to an active state, and the remaining flip-flops are triggered by the vertical synchronization signal input to a reset terminal such that an output logic thereof is initialized to an inactive state.

6. The image sensor of claim 5, wherein the horizontal scanning circuit comprises:

first to Nth data latch sections storing the data signals inputted thereto one signal after another and producing, according to a predetermined trigger signal, a latch output of the data signals to pixels constituting rows for which the latch output is produced; and a latch control section cyclically outputting the trigger signal to one of the first to the Nth data latch sections every said horizontal scanning period.

* * * * *